United States Patent
Hargreaves et al.

(10) Patent No.: US 6,922,054 B2
(45) Date of Patent: Jul. 26, 2005

(54) STEADY STATE FREE PRECESSION MAGNETIC RESONANCE IMAGING USING PHASE DETECTION OF MATERIAL SEPARATION

(75) Inventors: Brian A. Hargreaves, Menlo Park, CA (US); Shreyas Vasanawala, Stanford, CA (US)

(73) Assignee: The Board of Trustees of The Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 10/643,286

(22) Filed: Aug. 18, 2003

(65) Prior Publication Data

US 2005/0040821 A1 Feb. 24, 2005

(51) Int. Cl.[7] ................................................. G01V 3/00
(52) U.S. Cl. ........................................................ 324/307
(58) Field of Search ................................ 324/307, 369; 600/410

(56) References Cited

U.S. PATENT DOCUMENTS

| | | |
|---|---|---|
| 4,769,603 A | 9/1988 | Oppelt et al. |
| 5,144,235 A | 9/1992 | Glover et al. |
| 5,225,781 A | 7/1993 | Glover et al. |
| 5,541,514 A | 7/1996 | Heid et al. |
| 5,655,531 A | 8/1997 | Nishimura et al. |
| 6,307,368 B1 | 10/2001 | Vasanawala et al. |
| 6,339,332 B1 | 1/2002 | Deimling |
| 6,366,090 B1 | 4/2002 | Heid |
| 6,369,569 B1 | 4/2002 | Heid |
| 6,404,195 B1 | 6/2002 | Deimling |
| 6,442,414 B1 * | 8/2002 | Watanabe ................... 600/419 |
| 6,452,387 B1 | 9/2002 | Hargreaves et al. |
| 6,583,623 B1 * | 6/2003 | Kwok et al. ................. 324/307 |
| 6,587,708 B2 * | 7/2003 | Venkatesan et al. ........ 600/419 |
| 2002/0167318 A1 * | 11/2002 | Hennig ....................... 324/307 |
| 2003/0030436 A1 * | 2/2003 | Hennig et al. .............. 324/307 |
| 2004/0152969 A1 * | 8/2004 | Zhang et al. ............... 600/422 |

OTHER PUBLICATIONS

Hargreaves et al., "Fat Suppressed Steady–State Free Precession Imaging Using Phase Detection," Magnetic Resonance in Medicine 50:210–213 (2003).

* cited by examiner

Primary Examiner—Brij Shrivastav
Assistant Examiner—Dixomara Vargas
(74) Attorney, Agent, or Firm—Beyer Weaver & Thomas LLP

(57) ABSTRACT

Magnetic resonance imaging of a body uses steady state free precession with material separation for the selective imaging of two species, such as blood or fat. The refocusing property of SSFP is used with signal phase detection to suppress either water or lipid. Phase and/or frequency of the RF excitation pulse and repetition time are selected so that resonant frequencies of water, fw, and lipid, fl, are on opposite sides of the signal null frequency.

16 Claims, 4 Drawing Sheets

STEADY STATE FREE PRECESSION MAGNETIC RESONANCE IMAGING USING PHASE DETECTION OF MATERIAL SEPARATION

GOVERNMENT RIGHTS

The U.S. government has rights in the disclosed invention pursuant to NIH grants to Stanford University including NIH-HL39297, NIH-HL56394, NIH-AR46904, and NIH-CA50948.

BACKGROUND OF THE INVENTION

This invention relates generally to magnetic resonance imaging (MRI), and more particularly the invention relates to steady state free precession (SSFP) imaging in which selective material imaging is achieved using phase detection.

Magnetic resonance imaging (MRI) provides excellent soft tissue contrast with arbitrary scan-volume orientations, thus making MRI an extremely useful medical imaging modality. However, in many applications, MRI is limited by long scan times, limited spatial resolution, and contrast between lipid-based tissue and water-based tissue. Recent advances in gradiant amplifier technology have enabled the use of fully-refocused steady-state free precession (SSFP) imaging methods. SSFP imaging is a very fast method that can provide good tissue contrast and high resolution. A number of commercial implementations of SSFP are available, all of which conceptually identical.

Recently, several methods have been proposed for SSFP imaging with fat suppression, which provides the necessary contrast between water and lipid. Fluctuating-equilibrium MRI, suppression of lipids by RF-modulated FIESTA, and linear-combination SSFP generates steady-state spectral profiles that suppress the frequency band containing lipid tissue. All of these techniques require at least twice the acquisition time of standard SSFP. Magnetization-prepared SSFP methods which manipulate magnetization into the steady-state after a fat-presaturation pulse are only slightly slower than standard SSFP. However, these methods can result in severe artifacts from transient lipid magnetization.

SUMMARY OF THE INVENTION

In accordance with the invention, phase sensitive SSFP provides selective material imaging without additional complexity or scan time in conventional SSFP. Repetition time, TR and scan center frequency are chosen such that an odd number of phase transitions are between resonant frequencies for two species, whereby signal phase can be used to separate the two species.

In one embodiment for suppressing fat while imaging blood, the invention employs excitation repetition time as the reciprocal of the chemical shift difference between water (blood) and lipid (fat). Further, the SSFP signal is refocused halfway between the radio frequency excitation pulses, with the signal phase alternating as a function of resonant frequency. This results in water and lipid signals having opposite signs or phases. By choosing a positive or negative signal, water-only or lipid-only images can be generated.

The invention and object and features thereof will be more readily apparent from the following detailed description and appended claims when taken with the drawings.

DETAILED DESCRIPTION OF ILLUSTRATED EMBODIMENTS

Figure 1:
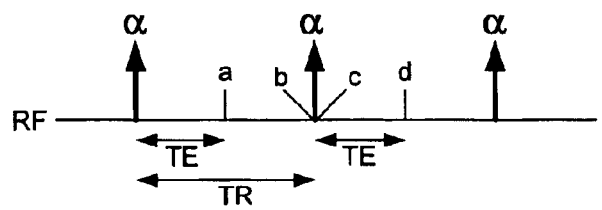
FIG. 1 illustrates a SSFP pulse sequence.

As illustrated in FIG. 1, a refocused SSFP sequence consists of a single RF excitation which is repeated periodically. All gradients used for slice selection or imaging are fully rewound over each repetitive time, TR. In the steady-state, the magnetization at points a and d is the same.

Magnetization is tipped about a traverse axis through an angle $\alpha$. Between excitations, the magnetization undergoes a precession by an angle $\theta=2\pi\Delta fTR$ about the z-axis, where $\Delta f$ is the tissue off-resonance, and also experiences both T1 and T2 relaxation.

During the sequence each spin is affected by RF pulses, relaxation and free precession. The steady-state magnetization for SSFP is a function of the sequence parameters flip angle ($\alpha$), repetition time (TR) and echo time (TE) as well as the tissue parameters T1, T2, and resonant frequency shift $\Delta f$.

Figure 2A:
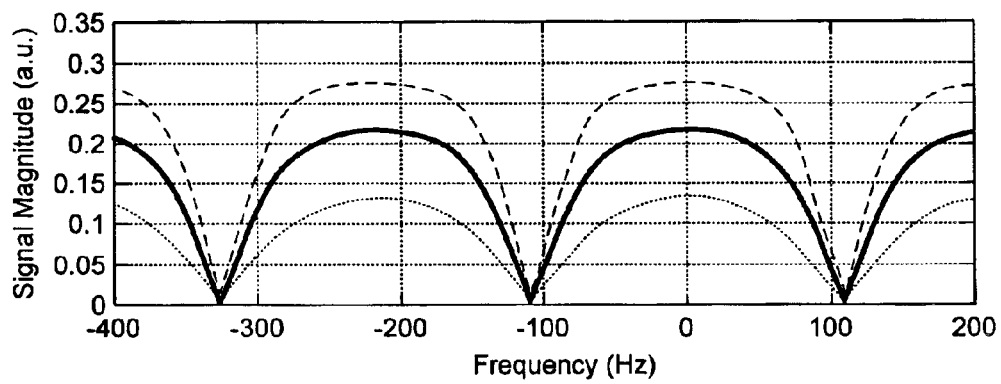
FIGS. 2A, 2B illustrate SSFP signal magnitude and phase, respectively, for different T1/T2 combinations.

All imaging gradients are rewound, and the low spatial frequency-information is acquired at an echo time (TE) midway between RF excitation pulses. The steady-state signal that arises after many repetitions is shown in FIG. 2A. The signal magnitude is a strong function of the resonant frequency, with signal nulls spaced apart by 1/TR. The magnitude also varies for different relaxation times T1 and T2 as is typical for MRI sequences.

Figure 2B:
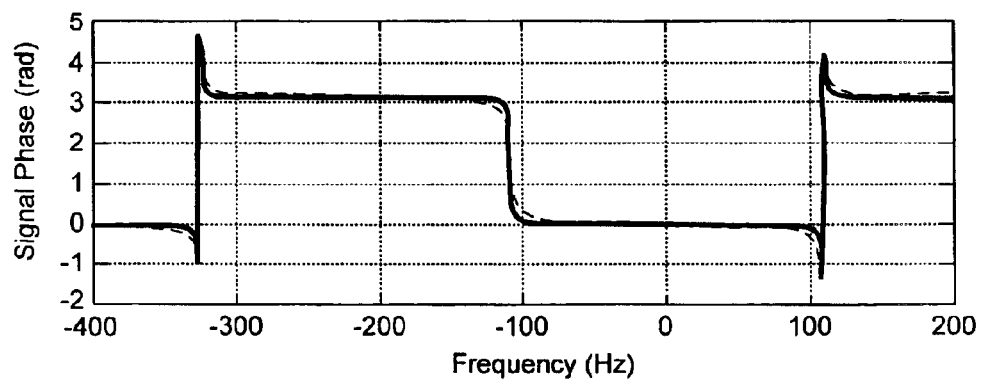

FIGS. 2A and 2B illustrate SSFP signal magnitude and phase, respectively, as a function of resonant frequency at TE=TR/2=2.3 ms. Three different T1/T2 combinations are shown including T1/T2=100/200 ms (solid line), T1/T2=1000/100 ms (dotted line), and T1/T2=200/60 ms (dashed line) corresponding approximately to arterial blood, venous blood and lipid.

The signal phase in SSFP is, to a good approximation, a square-wave function of resonant frequency. At each signal null, the phase changes rapidly by $\pi$ radians. However, between signal hulls, the phase is very flat. This means that over small frequency variations, the magnetization is refocused in a similar way to spin echo sequences, except that the direction of the "echo" alternates with frequency.

Since water and lipid have different resonant frequencies, in accordance with the invention, their signals can be separated based on the RF signal phase with appropriate choice of repetition time, TR, so that the resonant frequencies of water, fw, and lipid, fl, are on opposite sides of the signal null at scan center frequency. Although this separation is theoretically possible for any choice of TR, a good choice is to select TR as the reciprocal of the resonant frequency difference between lipid and water. This choice centers the water and lipid spectral peaks in successive signal passbands, as shown in FIG. 2A.

Figure 3:
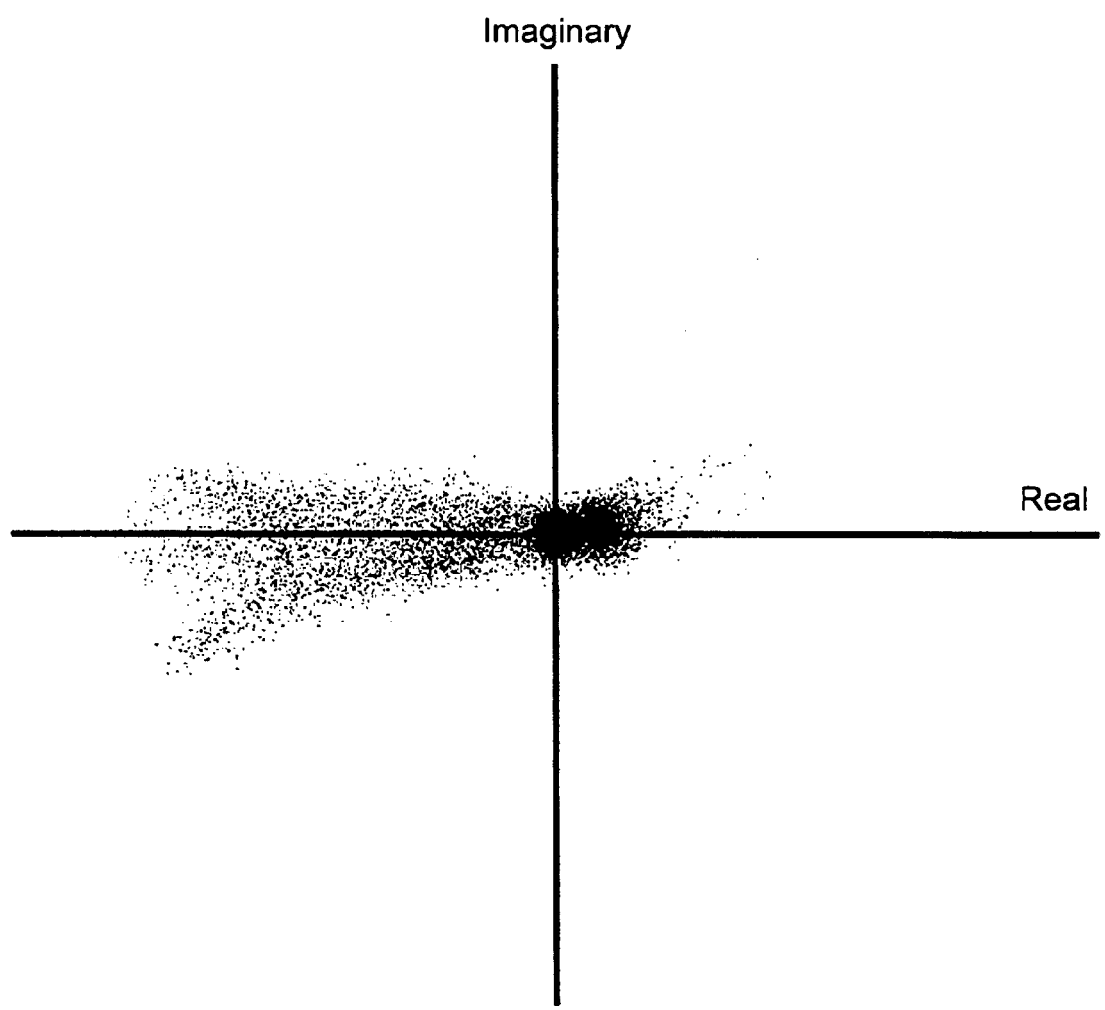
FIG. 3 is a scatter plot of complex image pixels illustrating distribution along the real axis corresponding to signal phases of zero and pi.

Using TR=2TE=4.6 ms at 1.5T, and a flip angle of 60 degrees, 3D SSFP images were acquired of the lower leg of a normal volunteer. Imaging parameters were a resolution of 1×1×1 mm$^3$ over a 38×12×12 cm$^3$ field of view, and the scan time was just 75 seconds. The images were reconstructed using a standard Fourier reconstruction, with care taken so that no linear phase results from the Fourier transform in the images. The complex signal points are plotted in a scatter plot shown in FIG. 3, with the points distributed along the real axis, corresponding to signal phases of zero and pi.

Figure 4:
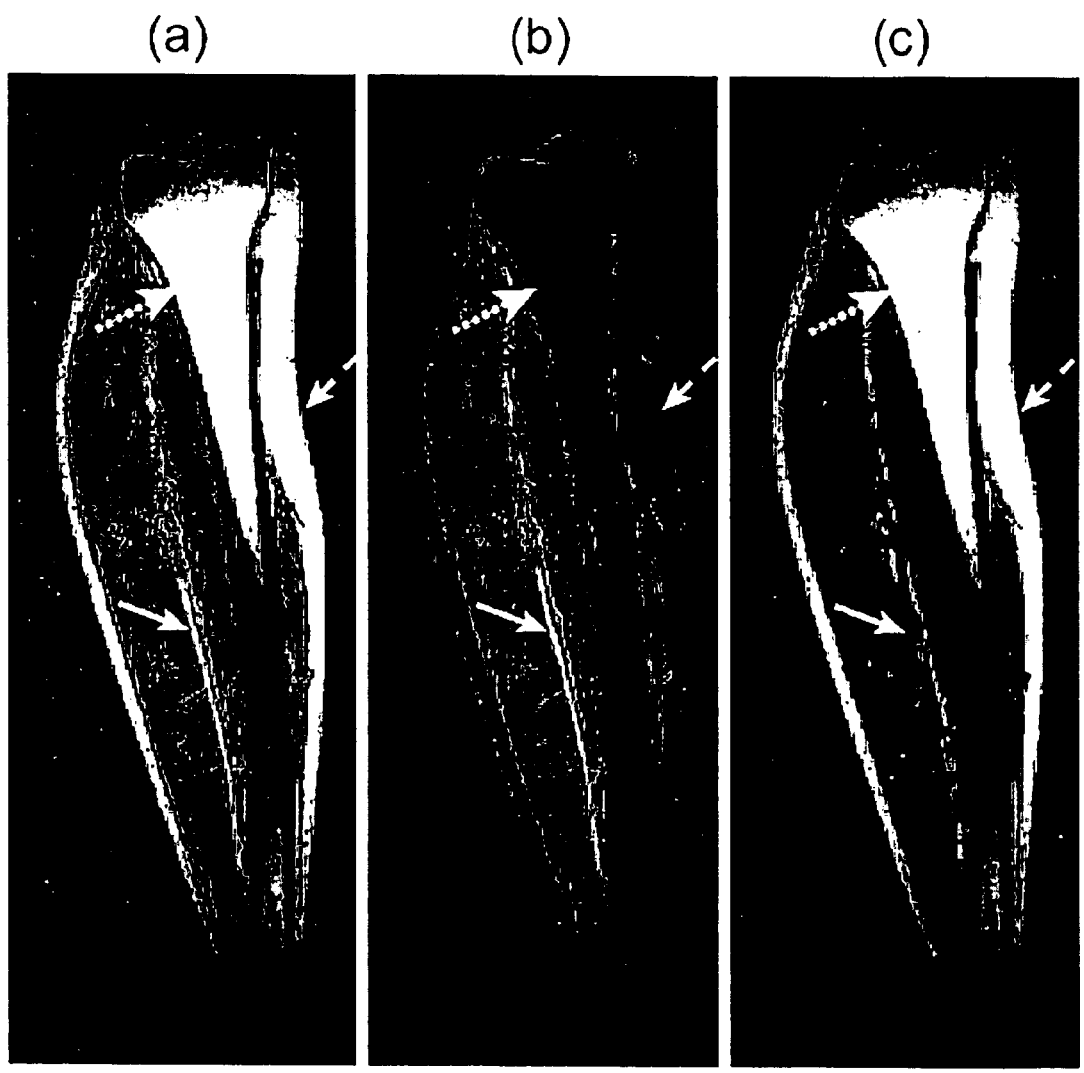
FIG. 4 illustrates separation of a standard SSFP image into water-only and lipid-only images using the invention.

The image pixels are separated into water and lipid images based on the sign of the real-part of the signal. The resulting separation is very good as shown in FIG. 4. Here, the standard SSFP image (a) is separated into water-only (b) and lipid-only (c) images by keeping only the pixels with positive and negative real parts respectively. Lipid areas such as subcutaneous fat (dashed arrow) or bone marrow (dotted arrow) are retained in the fat-only image, while arterial blood (solid arrow) is retained in the water-only image.

Figure 5:
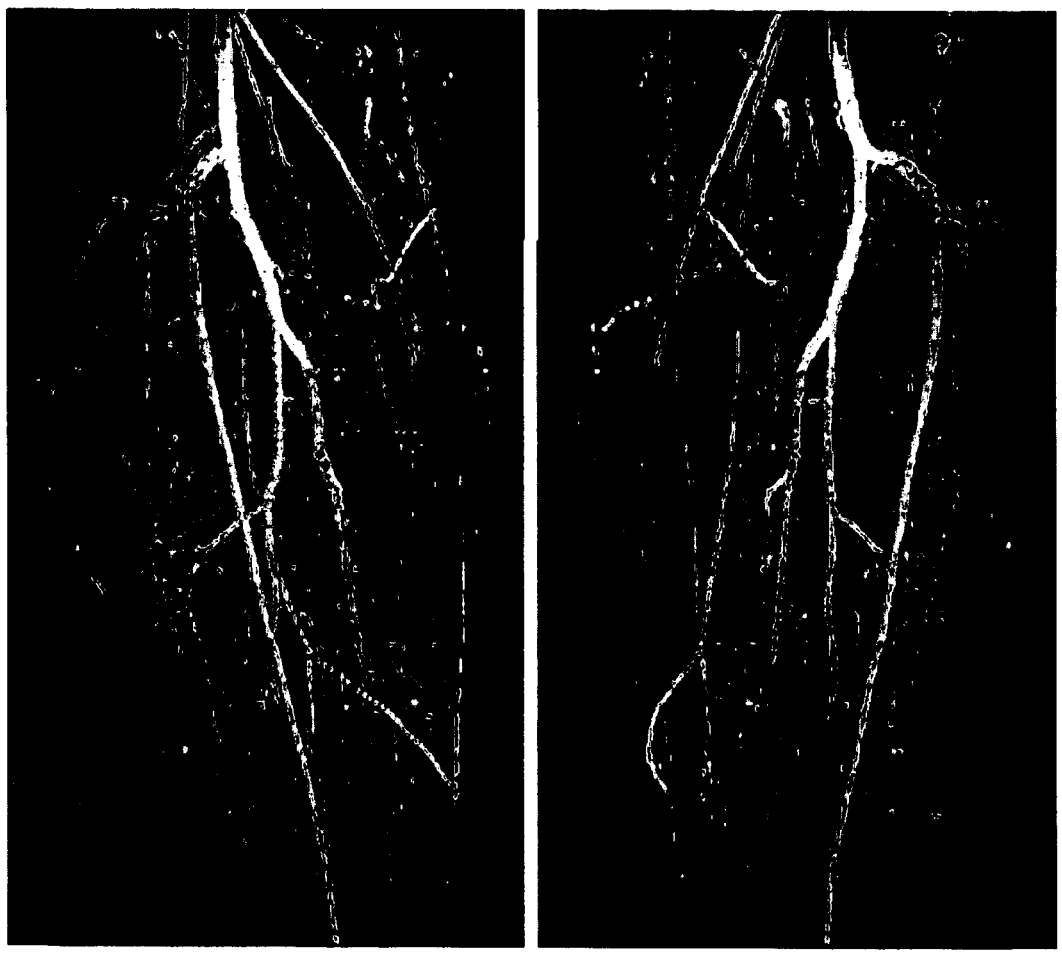
FIG. 5 illustrates maximum intensity projections along two different angles for water only (blood) images with contrast separation between arteries and veins.

Using a maximum-intensity projection, the vessels in the lower leg can be clearly depicted. FIG. 5 shows the maximum-intensity projections along two different angles. The fat-suppression provides the very good contrast between arterial blood and both bone marrow and subcutaneous lipid. The T2-like SSFP contrast separates the arteries (bright signal) from veins (intermediate signal).

Compared with other fat suppressed imaging methods such as RARE or RF-spoiled imaging, the method according to the invention provides the benefits of SSFP imaging including 3D imaging with rapid scan times and T2-like contrast. SSFP is significantly faster than RARE, and 3D acquisitions are possible in reasonably short scan times. Compared with other fat-suppressed SSFP imaging methods, the invention provides fat-suppression with no addition of scan time and is less sensitive to off resonance than fluctuating MR or linear-combination SSFP. Unlike the magnetization-prepared SSFP techniques, it is not sensitive to transient artifacts.

The invention applies to a standard SSFP imaging sequence where the echo time is midway between RF excitation pulses. The most common such method is simple Cartesian imaging. However, the method will also work for radial SSFP imaging, echo-planar SSFP imaging, or spiral in-out imaging.

For applications such as angiography, moment-nulling can be extremely important, as it allows a steady-state to evolve from materials that are moving as well as static materials. Since the method is based on steady-state signal, it may be useful to use a trajectory that is moment-nulled over a sequence repetition in all three dimensions. Examples of this type of trajectory are 3D projection-reconstruction imaging or the more efficient "hour glass" trajectory. In moment nulling, higher order moments are refocused by adding a lobe to each gradient field.

The spin-echo-like property of SSFP sequences is not limited to standard SSFP. Other sequences, such as fluctuating equilibrium MR which vary the phase of the RF pulse will also tend to have time points where the phase is refocused, as well as phase discontinuities of pi radians. Since the sequences can have additional magnitude variations, it may be desirable to use both signal magnitude and signal phase for tissue contrast. Variation of the RF phase in SSFP can have applicability for synthesizing frequency profiles. Combining various acquisitions can be extremely useful for improving the robustness of the invention to magnetic field variations or susceptibility-induced frequency shifts.

There has been described a new, rapid material suppressed imaging technique using standard SSFP imaging with a phase-sensitive reconstruction. The invention exploits the refocusing property of SSFP to provide a robust fat-suppression technique that is only as sensitive to off resonance as the SSFP sequence itself. In using standard SSFP imaging, the repetition time (TR) is approximately equal to the reciprocal of chemical shift between lipid and water, and the effective echo time (TE) is equal to TR/2.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of magnetic resonance imaging (MRI) in a body using steady-state free precession with material separation comprising the steps of:
   a) placing the body in a magnetic field,
   b) applying axial magnetic fields to the body,
   c) applying a plurality of RF excitation pulses to the body at a repetition rate, TR, to flip nuclei spins,
   d) imaging nuclei spins at an echo time, TE, less than TR,
   e) rewinding all gradients over the repetitive time, TR, and
   f) measuring refocused MRI signals with the phases of the measured signals being used to separate materials.

2. A method as defined by claim 1 wherein the body includes a first species with a resonant frequency f1 and a second species with a resonant frequency f2, where TR and scan center frequency are chosen such that an odd number of phase transitions are between f1 and f2 whereby signal phase can be used to separate the two species.

3. The method as defined by claim 2 wherein a first species, blood, is imaged and a second species, lipid is suppressed.

4. The method as defined by claim 3 wherein repetitive rate, TR, and scan center frequency are selected as the reciprocal of resonant frequency differences between lipid and water whereby water and lipid spectral signal peaks occur in successive signal pass-bands.

5. The method as defined by claim 4 wherein the phase angles of water and of lipid signal peaks vary by 180 degrees.

6. The method as defined by claim 2 wherein the steady-state free precession imaging is selected from the group consisting of Cartesian imaging, radial imaging, echo-planar imaging, and spiral in-spiral out imaging.

7. The method as defined by claim 2 and further including the step of moment nulling over the repetitive time for imaging moving material.

8. The method as defined claim 7 wherein the moment nulling occurs over a repetition time in three dimensions.

9. The method as defined by claim 1 wherein the body includes water with a resonant frequency fw and lipid with a resonant frequency fl, where TR and scan center frequency are chosen such that an odd number of phase transitions are between fw and fl whereby signal phase can be used to separate the two species.

10. The method as defined by claim 9 wherein bone marrow and fat are imaged.

11. The method as defined by claim 9, wherein repetitive rate, TR, is selected as the reciprocal of resonant frequency differences between lipid and water, whereby water and lipid spectral signal peaks occur in successive signal pass-bands.

12. The method as defined by claim 11 wherein the phase angles of water and lipid signal peaks vary by 180 degrees.

13. The method as defined by claim 1 wherein the steady-state free precession imaging is selected from the group consisting of Cartesian imaging, radial imaging, echo-planar imaging, and spiral in-spiral out imaging.

14. The method as defined by claim 1 and further including the step of moment nulling over the repetitive time for imaging moving material.

15. The method as defined claim 14 wherein the moment nulling in three-dimensions occurs over a repetition time in three dimensions.

16. The method as defined by claim 1 wherein in step d) echo time, TE, is one-half TR.

* * * * *